US012805043B2

(12) United States Patent
Tadmor et al.

(10) Patent No.: US 12,805,043 B2
(45) Date of Patent: Nov. 17, 2026

(54) IMAGE SENSORS WITH INTEGRATED VISIBLE AND INFRARED LIGHT PIXELS

(71) Applicant: SEMICONDUCTOR COMPONENTS INDUSTRIES, LLC, Scottsdale, AZ (US)

(72) Inventors: Erez Tadmor, Atlit (IL); Swarnal Borthakur, Boise, ID (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 219 days.

(21) Appl. No.: 18/742,151

(22) Filed: Jun. 13, 2024

(65) Prior Publication Data

US 2025/0386110 A1 Dec. 18, 2025

(51) Int. Cl.
*H10F 39/00* (2025.01)
*H04N 23/11* (2023.01)
(Continued)

(52) U.S. Cl.
CPC ......... *H10F 39/8063* (2025.01); *H04N 23/11* (2023.01); *H04N 25/131* (2023.01); *H04N 25/135* (2023.01); *H10F 39/8067* (2025.01)

(58) Field of Classification Search
CPC .............. H04N 25/131; H10F 39/8063; H10F 39/8067
See application file for complete search history.

(56) References Cited

U.S. PATENT DOCUMENTS

2007/0291982 A1* 12/2007 Sung .................... H04N 25/131 382/101
2008/0074505 A1* 3/2008 Ryde ...................... H04N 23/84 348/207.99

(Continued)

FOREIGN PATENT DOCUMENTS

CN 114650359 A * 6/2022 ............. H04N 23/55

OTHER PUBLICATIONS

M. Miyata, M. Nakajima, & T. Hashimoto, "High-Sensitivity Color Imaging Using Pixel-Scale Color Splitters Based on Dielectric Metasurfaces", 6 ACS Photonics 1442-1450 (Mar. 25, 2019) (Year: 2019).*

(Continued)

*Primary Examiner* — David N Werner
(74) *Attorney, Agent, or Firm* — Dickinson Wright PLLC

(57) ABSTRACT

Image sensors, imaging systems, and methods for constructing image sensors. The image sensor includes a pixel array. The pixel array includes a first photosensitive region, a second photosensitive region, a spectral router, and a spectral filter. The first photosensitive region is configured to detect visible light within a color wavelength range. The second photosensitive region includes a plurality of light scattering structures. The second photosensitive region is configured to detect infrared light. The spectral router is positioned over at least the first photosensitive region. The spectral router is configured to route the visible light within the color wavelength range to the first photosensitive region. The spectral router is also configured to route the infrared light to the second photosensitive region. The spectral filter is positioned over the spectral router. The spectral filter is configured to block visible light outside of the color wavelength range.

18 Claims, 11 Drawing Sheets

(51) Int. Cl.
*H04N 25/13* (2023.01)
*H04N 25/131* (2023.01)

(56) References Cited

U.S. PATENT DOCUMENTS

2008/0087800 A1* 4/2008 Toda .................... H04N 25/131
257/E31.037
2008/0283728 A1* 11/2008 Inoue ................... H04N 25/131
438/48
2009/0147101 A1* 6/2009 Tatani ................... H10F 39/182
348/224.1
2012/0236190 A1* 9/2012 Ogasahara ........... G02B 3/0056
348/E9.01
2013/0083214 A1* 4/2013 Nakata .................. H10F 39/199
257/E31.127
2013/0222603 A1* 8/2013 Agranov .............. H04N 25/131
348/164
2014/0327783 A1* 11/2014 Nishiwaki ............ H04N 25/131
257/432
2014/0333814 A1* 11/2014 Tashiro ................ H04N 25/131
348/308
2015/0200220 A1* 7/2015 Juenger .................. H04N 23/11
438/70
2015/0221691 A1* 8/2015 Watanabe ............... G01J 3/513
257/432
2015/0268392 A1* 9/2015 Kobayashi ........... H04N 25/134
348/336
2015/0271377 A1* 9/2015 Li ........................ H04N 25/131
348/311
2015/0304582 A1* 10/2015 Hirota ................ G02B 27/0075
348/49
2016/0161332 A1* 6/2016 Townsend ............ H04N 25/131
359/359
2016/0191822 A1* 6/2016 Kosugou .............. A61B 5/1176
382/118
2017/0123452 A1* 5/2017 Evans, V ............... H04N 25/76
2018/0045953 A1 2/2018 Fan et al.
2018/0047773 A1* 2/2018 Gomi ..................... H04N 23/12
2018/0115730 A1* 4/2018 Velichko ................ H04N 25/59
2018/0213205 A1* 7/2018 Oh ........................ H10F 39/184
2019/0067346 A1* 2/2019 Borthakur .............. H04N 23/58
2019/0196068 A1 6/2019 Tsai et al.
2020/0041620 A1 2/2020 Onal et al.
2020/0057151 A1 2/2020 Finkelstein et al.
2020/0120315 A1* 4/2020 Ho ......................... H04N 23/11
2020/0273892 A1* 8/2020 Perkins ............... H10F 39/8053
2020/0280659 A1* 9/2020 Galor Gluskin ....... H04N 23/55
2021/0066383 A1* 3/2021 Yen ..................... H10F 39/8053
2021/0118938 A1 4/2021 Roberts et al.
2021/0306580 A1* 9/2021 Lee ....................... H10F 39/807
2021/0375975 A1* 12/2021 Kobayashi ........... H04N 25/133
2021/0375977 A1* 12/2021 Lee ....................... H10F 39/182
2022/0028909 A1* 1/2022 Kim .................... H10F 39/8053
2022/0141399 A1* 5/2022 Dupoiron .............. H10F 39/192
348/164
2022/0141427 A1* 5/2022 Roh .................... H10F 39/8063
348/164
2022/0157869 A1* 5/2022 Hsieh ..................... H04N 25/76
2022/0190016 A1* 6/2022 Dupoiron .............. H10F 39/193
2022/0191411 A1* 6/2022 Gruhlke ................ G01J 3/2803
2022/0344388 A1* 10/2022 Ebiko ................... H10F 39/199
2022/0360759 A1* 11/2022 Miyata ................... H04N 23/10
2022/0415949 A1* 12/2022 Tanaka ................... H04N 23/12
2023/0037261 A1* 2/2023 Chao ........................ G02B 5/32
2023/0170363 A1* 6/2023 Huang ................ H10F 39/8063
2023/0230987 A1* 7/2023 Lee ...................... H04N 25/131
348/280
2023/0230989 A1* 7/2023 Borthakur ........... H10F 39/8053
257/482
2023/0283866 A1* 9/2023 Mase ...................... H04N 25/77
348/164
2023/0362518 A1* 11/2023 Shiina .................. H04N 25/131
2023/0387175 A1* 11/2023 Tsukuda ................... G01C 3/06
2023/0403478 A1* 12/2023 Hsu ....................... H10F 39/184
2024/0021634 A1* 1/2024 Wang .................. H10F 39/8053
2024/0107782 A1* 3/2024 Lee ....................... H10F 39/024
2024/0186349 A1* 6/2024 Lee ..................... H10F 39/8063
2024/0314417 A1* 9/2024 Ispasoiu ................. H04N 23/55
2024/0371898 A1* 11/2024 Banachowicz ....... H10F 39/024
2025/0277698 A1* 9/2025 Lee ....................... G01J 3/0205
2025/0280613 A1* 9/2025 Wang .................. H10F 39/8023
2025/0366236 A1* 11/2025 Hsieh .................... H10F 39/199

OTHER PUBLICATIONS

Camayd-Munoz, Philip, et al., "Multifunctional Volumetric Meta-Optics for Color and Polarization Image Sensors", Optica, vol. 7, No. 4, Apr. 2020, 4 pages.

Zhao, Nathan, et al., "Perfect RGB-IR Color Routers for Sub-Wavelength Size CMOS Image Sensor Pixels", Advanced Photonics Research, Jan. 2021, 16 pages.

* cited by examiner

IMAGE SENSORS WITH INTEGRATED VISIBLE AND INFRARED LIGHT PIXELS

BACKGROUND

Image sensors are used in electronic devices such as cellular telephones, cameras, and computers to capture images. In particular, an electronic device is provided with an array of image sensor pixels arranged in a grid pattern. Each image sensor pixel receives incident photons, such as light, and converts the photons into electrical signals. Column circuitry is coupled to each column for reading out sensor signals from each image sensor pixel.

Indirect Time-of-Flight (iToF) sensing is used in many industrial applications such as logistics, factory automation, medical, health, and agriculture. iToF sensing is also used in many consumer applications such as augmented reality, virtual reality, gaming, and object scanning. iToF sensing is further used in many automotive applications such as in-cabin monitoring and Light Detection and Ranging (LIDAR). iToF sensing measures distance by collecting reflected infrared light and discerning the phase shift between emitted and reflected infrared light.

SUMMARY

It is desirable to integrate visible and infrared sensing into a single sensor for both imaging and depth sensing. However, different split-pixel layouts with visible and infrared photodetectors provide different photon collection efficiencies. For example, consider two different red-green-green-blue-infrared (RGGBIR) color patterns. The first RGGBIR color pattern may provide good red and blue detection, but poor green and infrared detection. The second RGGBIR color pattern may provide good infrared detection, but poor red, green, and blue detection. The present disclosure provides image sensors, imaging systems, and methods that, among other things, increase overall photon collection efficiency using spectral routers to steer visible and infrared light according to wavelength.

The present disclosure provides an image sensor including a pixel array. The pixel array includes, in one implementation, a first photosensitive region, a second photosensitive region, a spectral router, and a spectral filter. The first photosensitive region is configured to detect visible light within a color wavelength range. The second photosensitive region includes a plurality of light scattering structures. The second photosensitive region is configured to detect infrared light. The spectral router is positioned over at least the first photosensitive region. The spectral router is configured to route the visible light within the color wavelength range to the first photosensitive region. The spectral router is also configured to route the infrared light to the second photosensitive region. The spectral filter is positioned over the spectral router. The spectral filter is configured to block visible light outside of the color wavelength range.

The present disclosure also provides a method for constructing an image sensor. The method includes forming a first photodetector configured to detect visible light within a color wavelength range. The method also includes forming a second photodetector configured to detect infrared light. The method further includes forming a spectral router over at least the first photodetector. The spectral router is configured to route the visible light within the color wavelength range to the first photodetector. The spectral router is also configured to route the infrared light to the second photodetector. The method also includes forming a spectral filter over at least the spectral router. The spectral filter is configured to block visible light outside of the color wavelength range.

The present disclosure further provides an imaging system including, in one implementation, a lens system, an imaging controller, and an image sensor. The image sensor is in operational relationship with the lens system. The image sensor is electrically coupled to the imaging controller. The image sensor includes a first photosensitive region, a first spectral filter, a second photosensitive region, a second spectral filter, a third photosensitive region, and a third spectral filter. The first photosensitive region includes one of more first pyramid trenches. The first photosensitive region is configured to detect visible light within a first color wavelength range. The first photosensitive region is also configured to detect infrared light. The first spectral filter is positioned over the first photosensitive region. The first spectral filter is configured to block visible light outside of the first color wavelength range. The second photosensitive region includes one of more second pyramid trenches. The second photosensitive region is configured to detect visible light within a second color wavelength range. The second photosensitive region is also configured to detect the infrared light. The second spectral filter is positioned over the second photosensitive region. The second spectral filter is configured to block visible light outside of the second color wavelength range. The third photosensitive region includes one or more third pyramid trenches. The third photosensitive region is positioned between the first photosensitive region and the second photosensitive region. The third photosensitive region is configured to detect the infrared light. The third spectral filter is positioned over the third photosensitive region. The third spectral filter is configured to block visible light.

BRIEF DESCRIPTION OF THE DRAWINGS

For a detailed description of example implementations, reference will now be made to the accompanying drawings in which.

DEFINITIONS

Figure 1A:
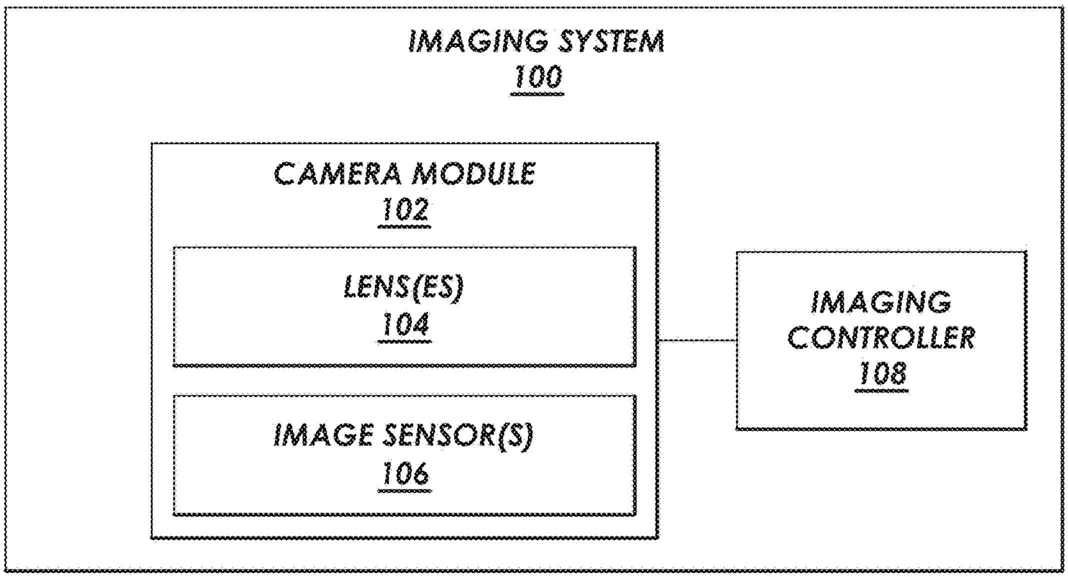
FIG. 1A is a block diagram of an example of an imaging system in accordance with some implementations.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

"A", "an", and "the" as used herein refers to both singular and plural referents unless the context clearly dictates otherwise. By way of example, "a processor" programmed to perform various functions refers to one processor programmed to perform each and every function, or more than one processor collectively programmed to perform each of the various functions. To be clear, an initial reference to "a [referent]", and then a later reference for antecedent basis purposes to "the [referent]", shall not obviate that the recited referent may be plural.

Terms defining an elevation, such as "above," "below," "upper", and "lower" shall be locational terms in reference to a direction of light incident upon a pixel array and/or an image pixel. Light entering shall be considered to interact with or pass objects and/or structures that are "above" and "upper" before interacting with or passing objects and/or structures that are "below" or "lower." Thus, the locational terms may not have any relationship to the direction of the force of gravity.

"About" in reference to a recited parameter shall mean the recited parameter plus or minus ten percent (+/−10%) of the recited parameter.

"Assert" shall mean creating or maintaining a first predetermined state of a Boolean signal. Boolean signals may be asserted high or with a higher voltage, and Boolean signals may be asserted low or with a lower voltage, at the discretion of the circuit designer. Similarly, "de-assert" shall mean creating or maintaining a second predetermined state of the Boolean, opposite the asserted state.

In relation to electrical devices, whether stand alone or as part of an integrated circuit, the terms "input" and "output" refer to electrical connections to the electrical devices, and shall not be read as verbs requiring action. For example, a differential amplifier, such as an operational amplifier, may have a first differential input and a second differential input, and these "inputs" define electrical connections to the operational amplifier, and shall not be read to require inputting signals to the operational amplifier.

"Controller" shall mean, alone or in combination, individual circuit components, an application specific integrated circuit (ASIC), a microcontroller with controlling software, a reduced-instruction-set computer (RISC) with controlling software, a digital signal processor (DSP), a processor with controlling software, a programmable logic device (PLD), a field programmable gate array (FPGA), or a programmable system-on-a-chip (PSOC), configured to read inputs and drive outputs responsive to the inputs.

"Visible light" shall mean light ranging between about 400 nanometers and 750 nanometers. "Infrared light" shall mean light ranging between about 750 nanometers and 1 millimeter. "Infrared light" shall also mean near-infrared light.

DETAILED DESCRIPTION

The following discussion is directed to various implementations of the invention. Although one or more of these implementations may be preferred, the implementations disclosed should not be interpreted, or otherwise used, as limiting the scope of the present disclosure, including the claims. In addition, one skilled in the art will understand that the following description has broad application, and the discussion of any implementation is meant only to be exemplary of that implementation, and not intended to intimate that the scope of the present disclosure, including the claims, is limited to that implementation.

Various examples are directed to image sensors, imaging systems, and related methods. More particularly, at least some examples are directed to image sensors designed and constructed to detect both visible and infrared light. More particularly, various examples are directed to image sensor pixels with spectral routers that steer visible and infrared light according to wavelength. More particularly, various examples are directed to image sensor pixels with spectral filters that filter visible light according to color. The specification now turns to an example system to orient the reader.

FIG. 1A shows an example of an imaging system 100. In particular, the imaging system 100 may be a portable electronic device such as a camera, a cellular telephone, a tablet computer, a webcam, a video camera, a video surveillance system, or a video gaming system with imaging capabilities. In other cases, the imaging system 100 may be an automotive imaging system. The imaging system 100 illustrated in FIG. 1A includes a camera module 102 that may be used to convert incoming light into digital image data. The camera module 102 may include one or more lenses 104 and one or more corresponding image sensors 106. The lenses 104 may include fixed and/or adjustable lenses. During image capture operations, light from a scene may be focused onto the image sensor 106 by the lenses 104. The image sensor 106 may comprise circuitry for converting analog pixel data into corresponding digital image data to be provided to the imaging controller 108. If desired, the camera module 102 may be provided with an array of lenses 104 and an array of corresponding image sensors 106.

The imaging controller 108 may include one or more integrated circuits. The imaging circuits may include image processing circuits, microprocessors, and storage devices, such as random-access memory, and non-volatile memory. The imaging controller 108 may be implemented using components that are separate from the camera module 102 and/or that form part of the camera module 102, for example, circuits that form part of the image sensor 106. Digital image data captured by the camera module 102 may be processed and stored using the imaging controller 108. Processed image data may, if desired, be provided to external equipment, such as computer, external display, or other device, using wired and/or wireless communications paths coupled to the imaging controller 108. The imaging controller 108 may perform Light Detection and Ranging (LIDAR) operations. For example, the digital image data captured by the camera module 102 may include one or more histograms, and the imaging controller 108 may perform an analysis of the one or more histograms to determine the combined time-of-flight of the outgoing interrogating infrared light and returning reflected infrared light.

Figure 1B:
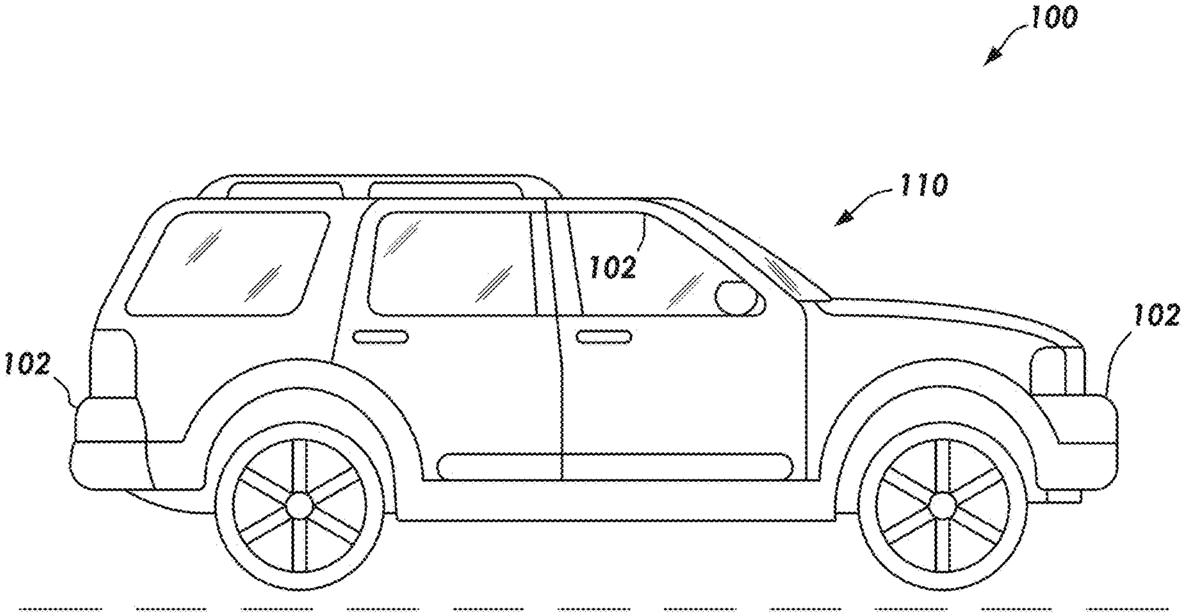
FIG. 1B is a diagram of an example of an imaging system incorporated in a vehicle in accordance with some implementations.

FIG. 1B shows another example of the imaging system 100. The imaging system 100 illustrated in FIG. 1B comprises an automobile or vehicle 110. The vehicle 110 is illustratively shown as a passenger vehicle, but the imaging system 100 may be other types of vehicles, including commercial vehicles, on-road vehicles, and off-road vehicles. Commercial vehicles may include busses and tractor-trailer vehicles. Off-road vehicles may include tractors and crop harvesting equipment. In the example of FIG. 1B, the vehicle 110 includes a forward-looking cameral module 102 arranged to capture images of scenes in front of the vehicle 110. Such forward-looking camera module 102 can be used for any suitable purpose, such as lane-keeping assist, collision warning systems, distance-pacing cruise-control systems, autonomous driving systems, and proximity detection. The vehicle 110 further comprises a backward-looking camera module 102 arranged to capture images of scenes behind the vehicle 110. Such backward-looking camera module 102 can be used for any suitable purpose, such as collision warning systems, reverse direction video, autonomous driving systems, proximity detection, monitoring position of overtaking vehicles, and backing up. The vehicle 110 further comprises a side-looking camera module 102 arranged to capture images of scenes beside the vehicle 110. Such side-looking camera module can be used for any suitable purpose, such as blind-spot monitoring, collision warning systems, autonomous driving systems, monitoring position of overtaking vehicles, lane-change detection, and proximity detection. In situation in which the imaging system 100 is a vehicle, the imaging controller 108 may be a controller of the vehicle 110. The discussion now turns in greater detail to the image sensor 106 of the camera module 102.

Figure 2:
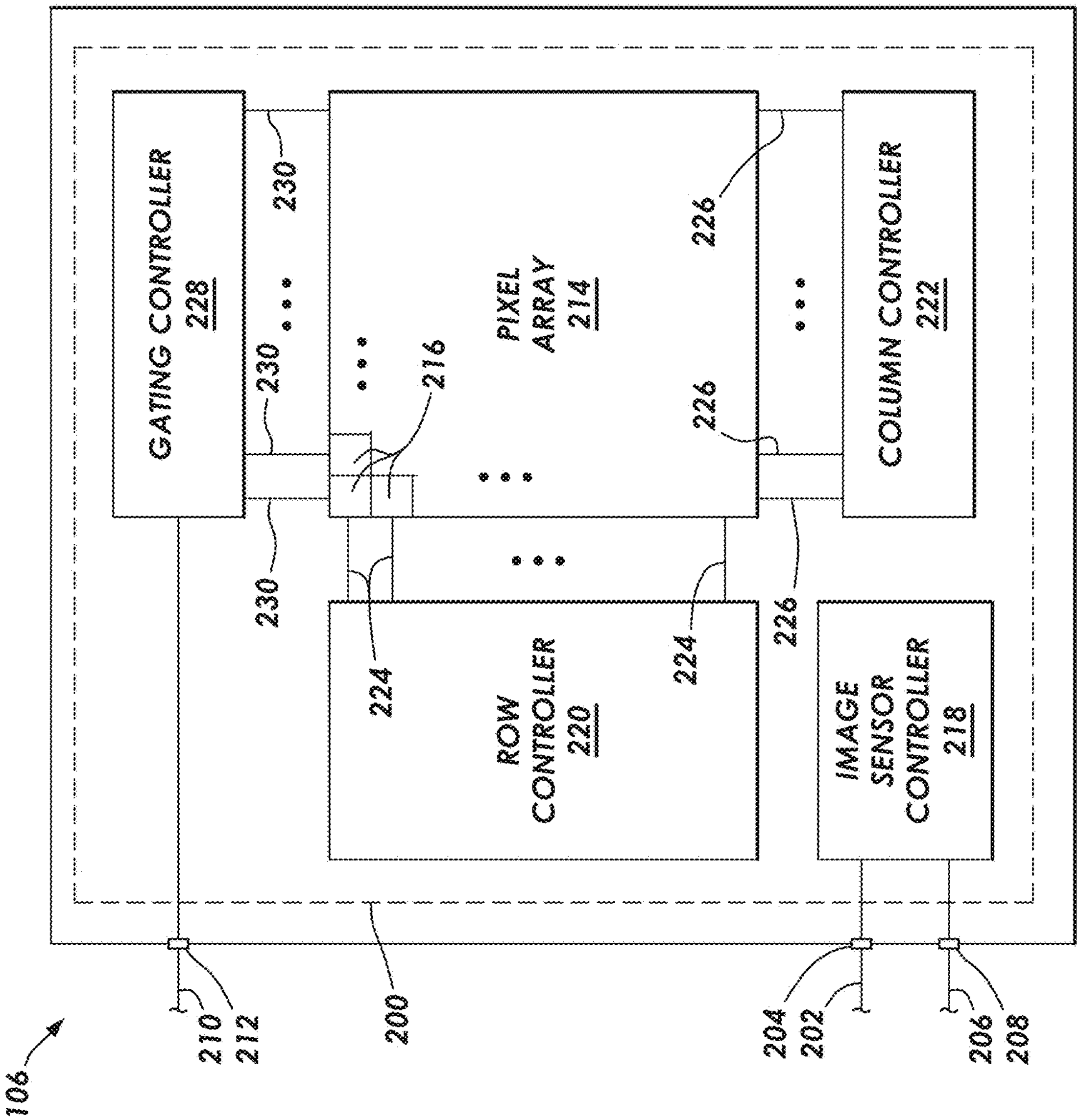
FIG. 2 is a partial schematic and a partial block diagram of an example of an image sensor in accordance with some implementations.

FIG. 2 shows an example of the image sensor 106. In particular, FIG. 2 shows that the image sensor 106 may comprise a substrate 200 of semiconductor material, such as silicon, encapsulated within packaging to create a packaged semiconductor device or packaged semiconductor product. Bond pads or other connection points of the substrate 200 couple to terminals of the image sensor 106. The connections may comprise a serial communication channel 202 coupled to a first terminal 204, a capture input 206 coupled to a second terminal 208, and a phase lock input 210 coupled to a third terminal 212. Additional terminals will be present, such as ground, common, or power, but the additional terminals are omitted so as not to unduly complicate the figure. While a single instance of the substrate 200 is shown, in other implementations, multiple substrates may be combined to form the image sensor 106 in a multi-chip module created before or after singulation.

The image sensor 106 illustrated in FIG. 2 includes a pixel array 214 comprising a plurality of pixels, such as pixels 216 arranged in rows and columns. The pixel array 214 may include, for example, hundreds or thousands of rows and columns of pixels 216. In some implementations, some of the pixels 216 are configured to detect visible light and some of the pixels 216 are configured to detect infrared light. Alternatively, or in addition, some of the pixels 216 are configured to detect visible light and infrared light. Control and readout of the pixel array 214 may be implemented by an image sensor controller 218 coupled to a row controller 220 and a column controller 222. The row controller 220 may receive row addresses from the image sensor controller 218 and supply corresponding row control signals to the pixels 216, such as reset, row select, charge transfer, and readout control signals. The row control signals may be communicated over one or more conductors, such as row control paths 224.

The column controller 222 may be coupled to the pixel array 214 by way of one or more conductors, such as column lines 226. Column controllers may sometimes be referred to as column control circuits, readout circuit, or column decoders. The column lines 226 may be used for reading out image signals or histograms from pixels 216 and for supplying bias currents and/or bias voltages to pixels 216. If desired, during readout operations, a pixel row in the pixel array 214 may be selected using the row controller 220 and image signals and/or histograms generated by the pixels 216 in that pixel row can be read out along the column lines 226. The column controller 222 may include sample-and-hold circuitry for sampling and temporarily storing signals read out from the pixel array 214, amplifier circuitry, analog-to-digital conversion (ADC) circuitry, bias circuitry, column memory, latch circuitry for selectively enabling or disabling the column circuitry, or other circuitry that is coupled to one or more columns of pixels 216 in the pixel array 214 for operating the pixels 216 and for reading out image signals and histograms from the pixel array 214. ADC circuitry in the column controller 222 may convert analog pixel values received from the pixel array 214 into corresponding digital data. The column controller 222 may supply image data to the image sensor controller 218 and/or the imaging controller 108 of FIG. 1A over, for example, the serial communication channel 202. The column controller 222 may also supply the histogram data to the image sensor controller 218. The image sensor controller 218 may determine the distance to reflected objects from the histogram data, or the image sensor controller 218 may supply the histogram data to the imaging controller 108 of FIG. 1A for such determinations.

Still referring to FIG. 2, the image sensor 106 may include a gating controller 228. The gating controller 228 is shown in FIG. 2 as separate and distinct from the column controller 222; however, in other cases the functionality of the gating controller 228 may be incorporated within the column controller 222. The gating controller 228 illustrated in FIG. 2 is coupled to the pixel array 214, and is designed and constructed to gate each of the pixels 216 that are configured to detect infrared light. The gating controller 228 gates these pixels 216 such that each of these pixels 216 is sensitive to reflected infrared light during respective activation periods. In particular, the gating controller 228 defines the phase lock input 210, and the gating controller 228 is coupled to the pixel array 214 by way of gating paths 230. The gating controller 228 receives, by way of the phase lock input 210, a sample signal or timing signal that defines a sample period. The timing signal may take any suitable form, such as a square wave that defines the sample period as the period of the square wave, or a sinusoid that defines the sample period as the period of the sinusoid. By selective arrangement of the gating signals, and responsive to the timing signal, the gating controller 228 activates the pixels 216 of the pixel array 214 such that each pixel is sensitive to reflected infrared during respective activation periods. Moreover, outside of each pixel's respective activation period, the gating controller 228 is designed and constructed to deactivate each pixel such that each pixel is insensitive to the reflected infrared.

Figure 3:
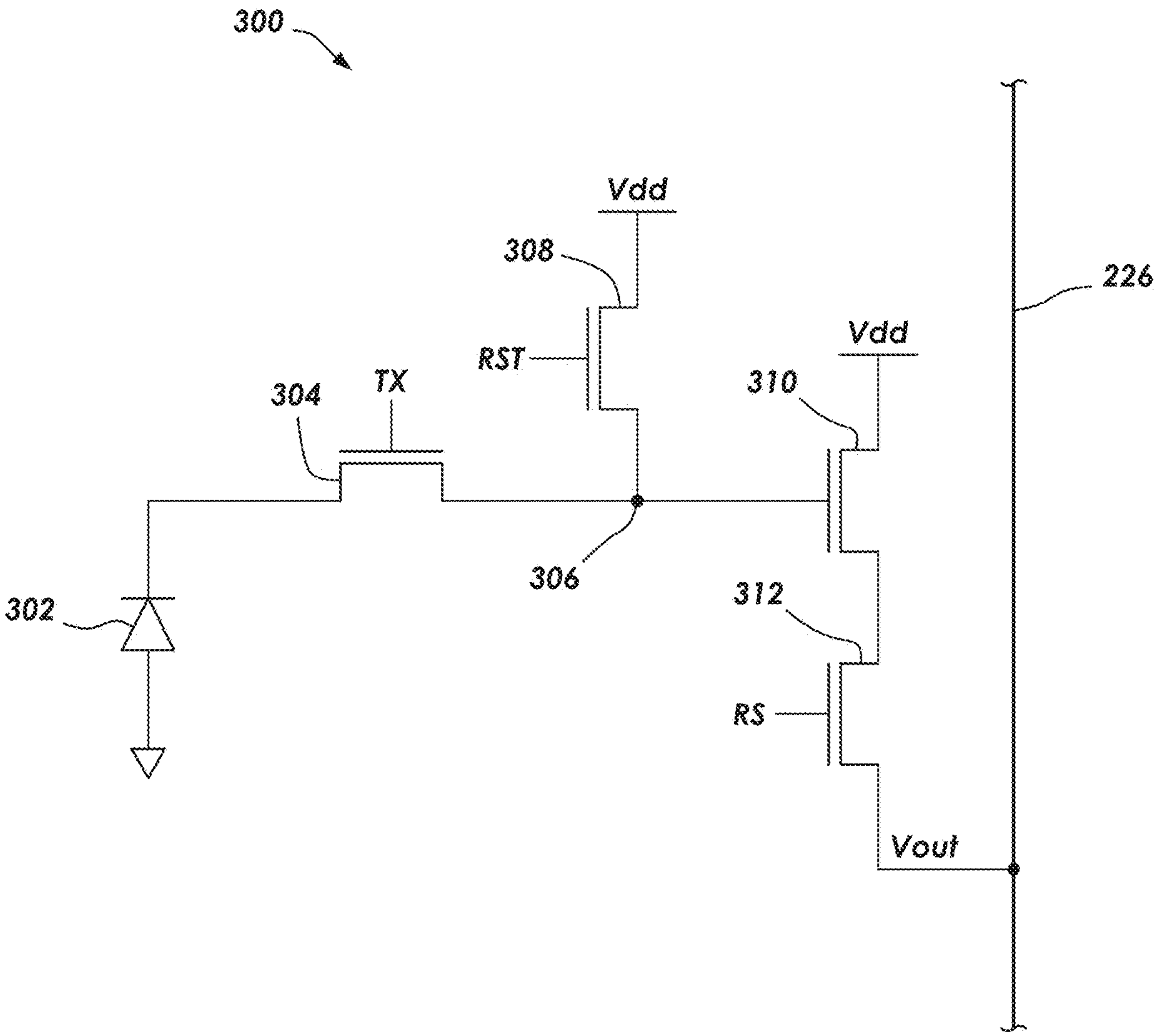
FIG. 3 is a schematic of an example of circuitry in a pixel configured to detect visible light in accordance with some implementations.

FIG. 3 is an electrical schematic of an example of a pixel 300 configured to detect visible light. The pixel 300 illustrated in FIG. 3 includes a photodetector 302 in the example form of a photodiode, a transfer transistor 304, a floating diffusion 306, a reset transistor 308, a source-follower transistor 310, and a row select transistor 312. In some implementations, some or all of the pixels 216 in the pixel array 214 may have the same components in the same configuration as the pixel 300 illustrated in FIG. 3. In other implementations, some or all of the pixels 216 in the pixel array 214 may have fewer components, additional components, or different components in different configurations than the pixel 300 illustrated in FIG. 3.

The photodetector 302 defines an anode coupled to ground or common, and a cathode coupled to the transfer transistor 304. Incoming light is gathered by the photodetector 302. The photodetector 302 converts the light to electrical charge. Before an image is acquired, a reset control signal RST may be asserted. As illustrated in FIG. 3, the reset control signal RST is applied to the gate terminal of the reset transistor 308. Thus, when the reset control signal RST is asserted, the reset transistor 308 is made conductive. A positive pixel power supply voltage, such as supply voltage Vdd, is coupled to the drain of the reset transistor 308. Thus, when the gate of the reset transistor 308 is asserted and the reset transistor 308 is conductive, the supply voltage Vdd is applied to the floating diffusion 306 and resets the floating diffusion 306 to a voltage equal or close to the supply voltage Vdd. The reset control signal RST may then be de-asserted to turn off the reset transistor 308.

After the reset process is complete, a transfer control signal TX may be asserted. As illustrated in FIG. 3, the transfer control signal TX is applied to the gate terminal of the transfer transistor 304. When the transfer control signal TX is asserted, the transfer transistor 304 is made conductive and charge generated by the photodetector 302 in response to incoming light is transferred to the floating diffusion 306. The floating diffusion 306 exhibits a capacitance that can be used to store the charge that has been transferred from the photodetector 302. A signal associated with the charge stored in the floating diffusion 306 is buffered by the source-follower transistor 310.

The row select transistor 312 connects the source-follower transistor 310 to one of the column lines 226. When a row select control signal RS is asserted, the row select transistor 312 is made conductive and outputs a signal Vout that is representative of the magnitude of charge stored in the floating diffusion 306. The output signal Vout is one example of a "pixel signal." When the row select control signal RS is asserted, one of the column lines 226 can be used to route the output signal Vout to readout circuitry, such as the column controller 222 in FIG. 2.

Figure 4:
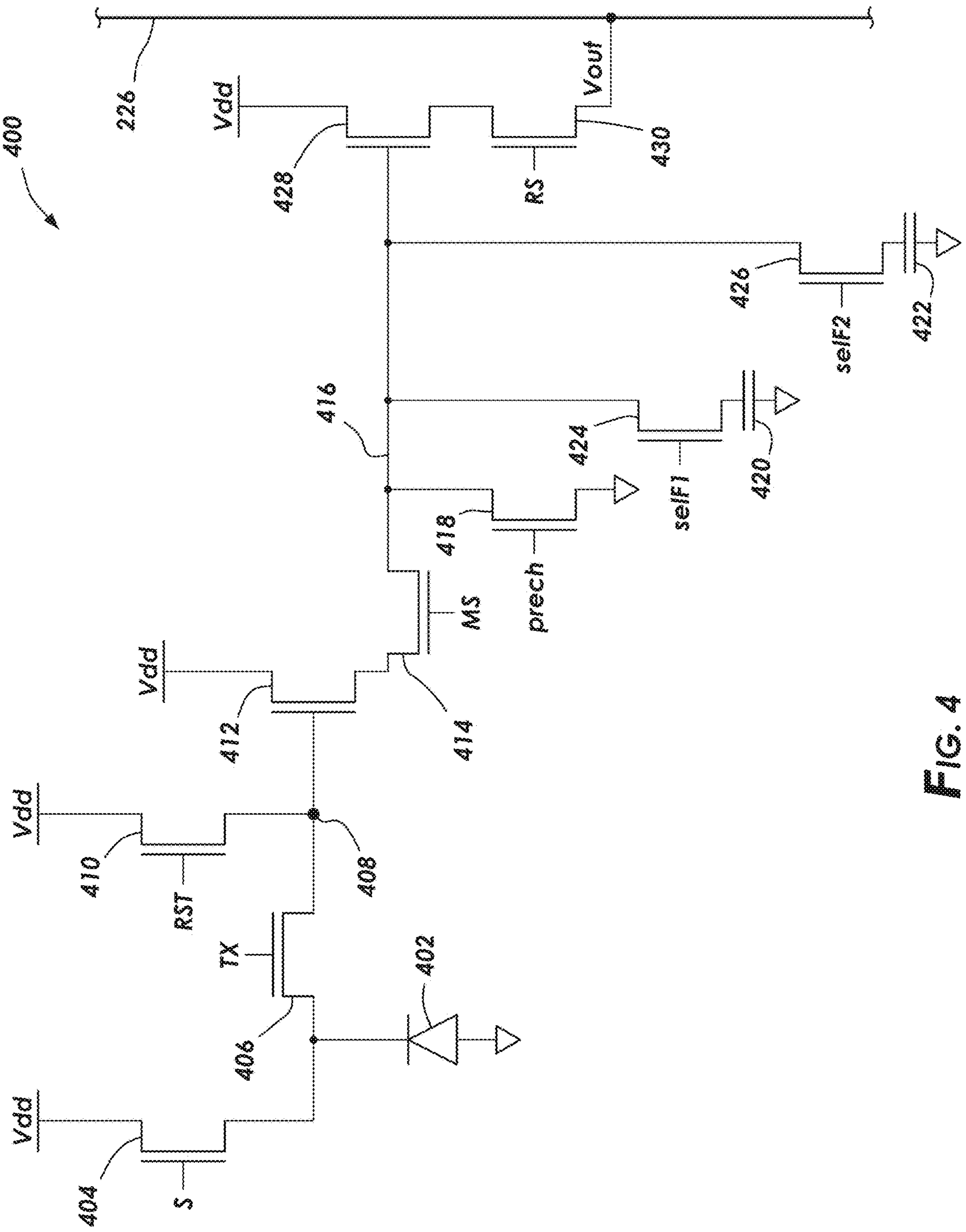
FIG. 4 is a schematic of an example of circuitry in a pixel configured to detect infrared light in accordance with some implementations.

FIG. 4 is an electrical schematic of an example of a pixel 400 configured to detect infrared light. The pixel 400 illustrated in FIG. 4 includes a photodetector 402 in the example form of a photodiode, a shutter transistor 404, a transfer transistor 406, a floating diffusion 408, a reset transistor 410, a first source-follower transistor 412, a memory select transistor 414, a memory node 416, a pre-charge transistor 418, a first memory capacitor 420, a second memory capacitor 422, a first select transistor 424, a second select transistor 426, a second source-follower transistor 428, and a row select transistor 430. In some implementations, some or all of the pixels 216 in the pixel array 214 may have the same components in the same configuration as the pixel 400 illustrated in FIG. 4. In other implementations, some or all of the pixels 216 in the pixel array 214 may have fewer components, additional components, or different components in different configurations than the pixel 400 illustrated in FIG. 4.

The photodetector 402 defines an anode coupled to ground or common, and a cathode coupled to the source of the shutter transistor 404. A positive pixel power supply voltage, such as supply voltage Vdd is coupled to the drain of the shutter transistor 404. When the gate of the shutter transistor 404 is asserted and the shutter transistor 404 is conductive, the supply voltage Vdd is applied to the cathode of the photodetector 402, reverse biasing the photodetector 402. During periods of time when the shutter transistor 404 is conductive, the photodetector 402 is effectively insensitive to the arrival of reflected light. More particularly, during periods of time when the shutter transistor 404 is conductive, any reflected infrared incident upon the photodetector 402 creates electrons within the photodetector 402, but the electrons are immediately drawn away into the positive pixel power supply voltage.

The transfer transistor 406 defines a drain coupled to the floating diffusion 408, a source coupled to the cathode of the photodetector 402, and a gate. During periods of time when the pixel 400 is active, the shutter transistor 404 is non-conductive and the transfer transistor 406 is conductive, coupling the photodetector 402 to the floating diffusion 408.

The reset transistor 410 defines a drain coupled to the positive pixel power supply voltage, a source coupled to the floating diffusion 408, and a gate. During periods of time when the reset transistor 410 is conductive, the voltage on the floating diffusion 408 is reset to a voltage equal or close to the supply voltage Vdd.

In order to transfer a voltage signal held on the floating diffusion 408, the floating diffusion 408 is coupled to a source-follower amplifier in the form of the first source-follower transistor 412. In particular, the gate of the first source-follower transistor 412 is coupled to the floating diffusion 408, the drain is coupled to the positive power supply voltage, and the source is selectively coupled to the downstream components by way of the memory select transistor 414. The drain of the memory select transistor 414 is coupled to the source of the first source-follower transistor 412, and the source of the memory select transistor 414 defines the memory node 416. Thus, signals created by the photodetector 402 and stored on the floating diffusion 408 may be transferred to the memory node 416 by way of the first source-follower transistor 412, the memory select transistor 414, and the pre-charge transistor 418, which provides a load for the first source-follower transistor 412. The memory node 416 enables the first memory capacitor 420 and the second memory capacitor 422 to sample and hold voltages driven to the memory node 416.

The first memory capacitor 420 is selectively coupled to the memory node 416 by way of the first select transistor 424 (selF1 in FIG. 4). Similarly, the second memory capacitor 422 is selectively coupled to the memory node 416 by way of the second select transistor 426 (selF2 in FIG. 4). The pre-charge transistor 418 defines a drain coupled to the memory node 416, a source coupled to ground or common, and a gate. In order to reset or prepare the first memory capacitor 420 and the second memory capacitor 422 for sampling operations, the pre-charge transistor 418 is made conductive along with the first select transistor 424 and the second select transistor 426. Thus, the first memory capacitor 420 and the second memory capacitor 422 may be reset to zero volts, or any tunable voltage.

Still referring to FIG. 4, the second source-follower transistor 428 defines a gate coupled to the memory node 416, a drain coupled to the positive pixel power supply voltage, and a source. The source of the second source-follower transistor 428 is coupled to the row select transistor 430 (MS in FIG. 4). When the row select transistor 430 is conductive, the column controller 222 is able to individually read out the voltages stored on the first memory capacitor 420 and the second memory capacitor 422. That is, the column controller 222 may read out the voltage stored on the first memory capacitor 420 by making the first select transistor 424 conductive, making the second select transistor 426 non-conductive, and making the row select transistor 430 conductive. Similarly, the column controller 222 may read out the voltage stored on the second memory capacitor 422 by making the first select transistor 424 non-conductive, making the second select transistor 426 conductive, and making the row select transistor 430 conductive.

Figure 5:
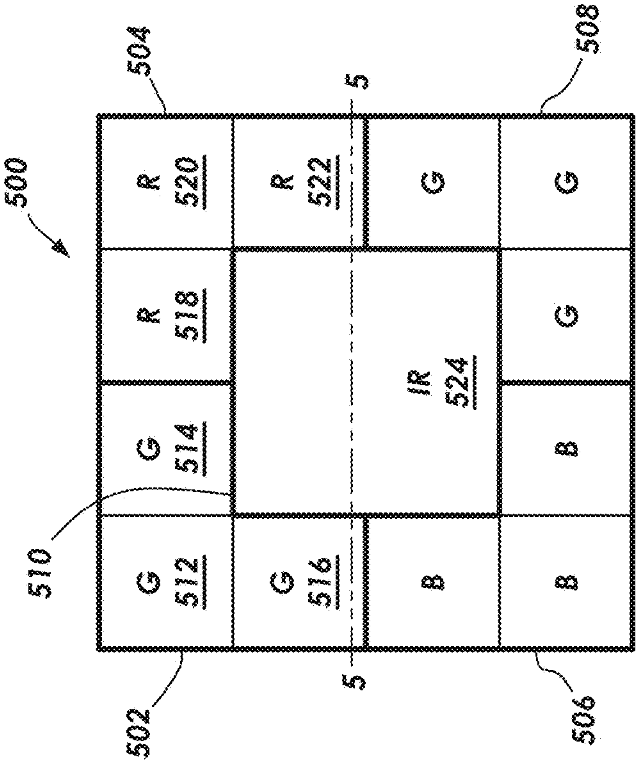
FIG. 5 is a view of an example of a first color pattern of split-pixels in accordance with some implementations.

FIG. 5 shows a view of an example of a first color pattern 500 of split-pixels. In particular, the first color pattern 500 includes a first green split-pixel 502, a red split-pixel 504, a blue split-pixel 506, a second green split-pixel 508, and an infrared pixel 510. The first green split-pixel 502 shown in FIG. 5 includes a first green photodetector 512, a second green photodetector 514, and a third green photodetector 516. The third green photodetector 516 is in one example a "first photosensitive region." The red split-pixel 504 shown in FIG. 5 includes a first red photodetector 518, a second red photodetector 520, and a third red photodetector 522. The third red photodetector 522 is in one example a "third photosensitive region." A similar discussion regarding the blue split-pixel 506 and the second green split-pixel 508, each of which may be configured in a same or similar manner, is omitted so as not to unduly lengthen the specification. The infrared pixel 510 shown in FIG. 5 includes an infrared photodetector 524. The infrared photodetector 524 is in one example a "second photosensitive region." In the example shown, the three photodetectors of the first green split-pixel 502 abut each other and the infrared photodetector 524, but in other cases one or more additional layers, such as oxide layers or deep trench isolation (DTI) structures, may reside between them. Further, in the example shown, the three photodetectors of the red split-pixel 504 abut each other and the infrared photodetector 524, but in other cases one or more additional layers, such as oxide layers or DTI structures, may reside between them. In some implementations, in accordance with 65 nanometer process design rules, each of the photodetectors in the first green split-pixel 502, the red split-pixel 504, the blue split-pixel 506, and the second green split-pixel 508 have a 1.4 micrometer pitch and the infrared photodetector 524 has a 2.8 micrometer pitch.

Figure 6A:
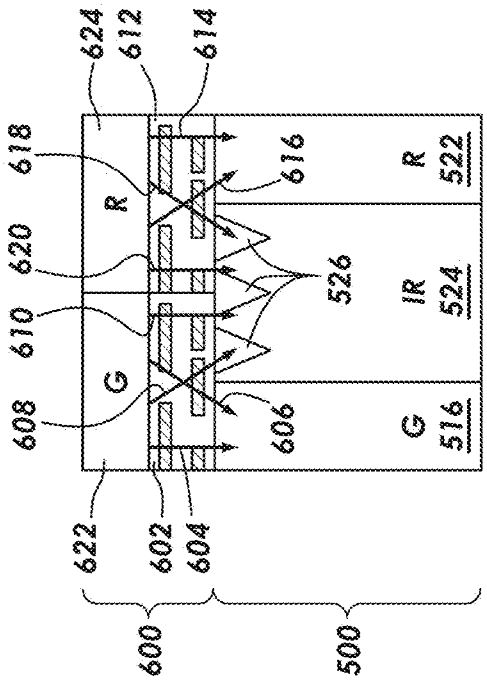
FIG. 6A is a cross-sectional view of a first spectral configuration for the first color pattern of FIG. 5 in accordance with some implementations.

FIG. 6A shows a cross-sectional view of a first spectral configuration 600 positioned above the first color pattern 500 of FIG. 5 in accordance with some implementations. The cross-sectional view in FIG. 6A is taken at line 5-5 of FIG. 5. Before discussing the first spectral configuration 600, note that FIG. 6A shows that the infrared photodetector 524 includes a plurality of pyramid trenches 526 configured to disperse infrared light evenly across the infrared photodetector 524. The plurality of pyramid trenches 526 is one example of a light scattering structure that may be included in the infrared photodetector 524. In some implementations, the infrared photodetector 524 may include other light scattering structures such as vertical trenches.

FIG. 6A shows that a green spectral router 602 is positioned above the third green photodetector 516 and above a portion of the infrared photodetector 524. Although not visible in the cross-sectional view of FIG. 6A, the green spectral router 602 is also positioned above the first green photodetector 512 and the second green photodetector 514. A spectral router (or nanophotonic light guide) is an optical structure that accepts photons incident on an upper surface. The spectral router then diverts photons from the upper surface to the underlying photosensitive regions of photodiodes. The green spectral router 602 is configured to direct incident light in the green wavelength range to the first green split-pixel 502, such as wavelengths between about 500 nanometers and 590 nanometers. The green wavelength range is one example of a "color wavelength range."

For example, the portion of the green spectral router 602 positioned above the third green photodetector 516 is configured to pass incident light in the green wavelength range to the third green photodetector 516. Consider, for purposes of discussion, green light entering the green spectral router 602 above the third green photodetector 516. An example of such green light is illustrated in FIG. 6A by arrow 604. The green light initially encounters a portion of the green spectral router 602 positioned above the third green photodetector 516, which passes the green light to the third green photodetector 516. Further, the portion of the green spectral router 602 positioned above the infrared photodetector 524 is configured to direct incident light in the green wavelength range to the third green photodetector 516. Consider, for purposes of discussion, green light entering the green spectral router 602 above the infrared photodetector 524. An example of such green light is illustrated in FIG. 6A by arrow 606. The green light initially encounters a portion of the green spectral router 602 positioned above the infrared photodetector 524, which directs the green light to the third green photodetector 516.

The green spectral router 602 is also configured to direct infrared light to the infrared pixel 510. For example, the portion of the green spectral router 602 positioned above the third green photodetector 516 is configured to direct infrared light to the infrared photodetector 524. Consider, for purposes of discussion, infrared light entering the green spectral router 602 above the third green photodetector 516. An example of such infrared light is illustrated in FIG. 6A by arrow 608. The infrared light initially encounters a portion of the green spectral router 602 positioned above the third green photodetector 516, which directs the infrared light to the infrared photodetector 524. Further, the portion of the green spectral router 602 positioned above the infrared photodetector 524 is configured to pass infrared light to the infrared photodetector 524. Consider, for purposes of discussion, infrared light entering the green spectral router 602 above the infrared photodetector 524. An example of such infrared light is illustrated in FIG. 6A by arrow 610. The infrared light initially encounters a portion of the green spectral router 602 positioned above the infrared photodetector 524, which passes the infrared light to the infrared photodetector 524.

FIG. 6A also shows that a red spectral router 612 is positioned above the third red photodetector 522 and above a portion of the infrared photodetector 524. Although not visible in the cross-sectional view of FIG. 6A, the red spectral router 612 is also positioned above the first red photodetector 518 and the second red photodetector 520. The red spectral router 612 is configured to direct incident light in the red wavelength range to the red split-pixel 504, such as wavelengths between about 590 nanometers and 690 nanometers.

For example, the portion of the red spectral router 612 positioned above the third red photodetector 522 is configured to pass incident light in the red wavelength range to the third red photodetector 522. Consider, for purposes of discussion, red light entering the red spectral router 612 above the third red photodetector 522. An example of such red light is illustrated in FIG. 6A by arrow 614. The red light initially encounters a portion of the red spectral router 612 positioned above the third red photodetector 522, which passes the red light to the third red photodetector 522. Further, the portion of the red spectral router 612 positioned above the infrared photodetector 524 is configured to direct incident light in the red wavelength range to the third red photodetector 522. Consider, for purposes of discussion, red light entering the red spectral router 612 above the infrared photodetector 524. An example of such red light is illustrated in FIG. 6A by arrow 616. The red light initially encounters a portion of the red spectral router 612 positioned above the infrared photodetector 524, which directs the red light to the third red photodetector 522.

The red spectral router 612 is also configured to direct infrared light to the infrared photodetector 524. For example, the portion of the red spectral router 612 positioned above the third red photodetector 522 is configured to direct infrared light to the infrared photodetector 524. Consider, for purposes of discussion, infrared light entering the red spectral router 612 above the third red photodetector 522. An example of such infrared light is illustrated in FIG. 6A by arrow 618. The infrared light initially encounters a portion of the red spectral router 612 positioned above the third red photodetector 522, which directs the infrared light to the infrared photodetector 524. Further, the portion of the red spectral router 612 positioned above the infrared photodetector 524 is configured to pass infrared light to the infrared photodetector 524. Consider, for purposes of discussion, infrared light entering the red spectral router 612 above the infrared photodetector 524. An example of such infrared light is illustrated in FIG. 6A by arrow 620. The infrared light initially encounters a portion of the red spectral router 612 positioned above the infrared photodetector 524, which passes the infrared light to the infrared photodetector 524.

FIG. 6A also shows that a first green spectral filter 622 is positioned above the green spectral router 602. The first green spectral filter 622 is configured to pass visible light in the green wavelength range and block (or absorb) visible light outside of the green wavelength range. The first green spectral filter 622 is also configured to pass infrared light. The first green spectral filter 622 is one example of a "first spectral filter." In some implementations, the green spectral router 602 and the first green spectral filter 622 are two separate layers, as shown in FIG. 6A. In other implementations, the green spectral router 602 and the first green spectral filter 622 may be a single layer. For example, the green spectral router 602 and the first green spectral filter 622 may be a single layer formed of inorganic $SiO_2/Si_3N_4$ or $SiO_2/TiO_2$ materials.

FIG. 6A further shows that a red spectral filter 624 is positioned above the red spectral router 612. The red spectral filter 624 is configured to pass visible light in the red wavelength range and block (or absorb) visible light outside of the red wavelength range. The red spectral filter 624 is also configured to pass infrared light. The red spectral filter 624 is one example of a "second spectral filter." The red spectral router 612 and the red spectral filter 624 may be two separate layers (as shown in FIG. 6A) or a single layer. In some implementations, a plurality of microlenses (not shown) is positioned over the first green spectral filter 622 and the red spectral filter 624.

Figure 6B:
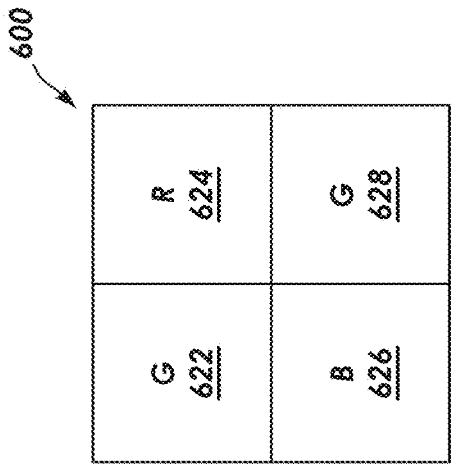
FIG. 6B is a top view of the first spectral configuration of FIG. 6A in accordance with some implementations.

FIG. 6B shows a top view of the first spectral configuration 600. As indicated in FIG. 6B, the first green spectral filter 622 is also positioned above the green split-pixel 502 comprising the first green photodetector 512, the second green photodetector 514, and the third green photodetector 516, as well as a portion of the infrared pixel 510. Further, as indicated in FIG. 6B, the red spectral filter 624 is also positioned above the red split-pixel 504 comprising the first red photodetector 518, the second red photodetector 520, and the third red photodetector 522, as well as a portion of the infrared pixel 510. FIG. 6B also indicates that a blue spectral filter 626 is positioned above the blue split-pixel 506 and a portion of the infrared pixel 510. The blue spectral filter 626 is configured to pass visible light in the blue wavelength range (such as wavelengths between about 400 nanometers and 500 nanometers) and block (or absorb) visible light outside of the blue wavelength range. The blue spectral filter 626 is also configured to pass infrared light. FIG. 6B also indicates that a second green spectral filter 628 is positioned above the second green split-pixel 508 and a portion of the infrared pixel 510. The second green spectral filter 628 is configured to pass visible light in the green wavelength range and block (or absorb) visible light outside of the green wavelength range. The second green spectral filter 628 is also configured to pass infrared light.

Figure 7A:
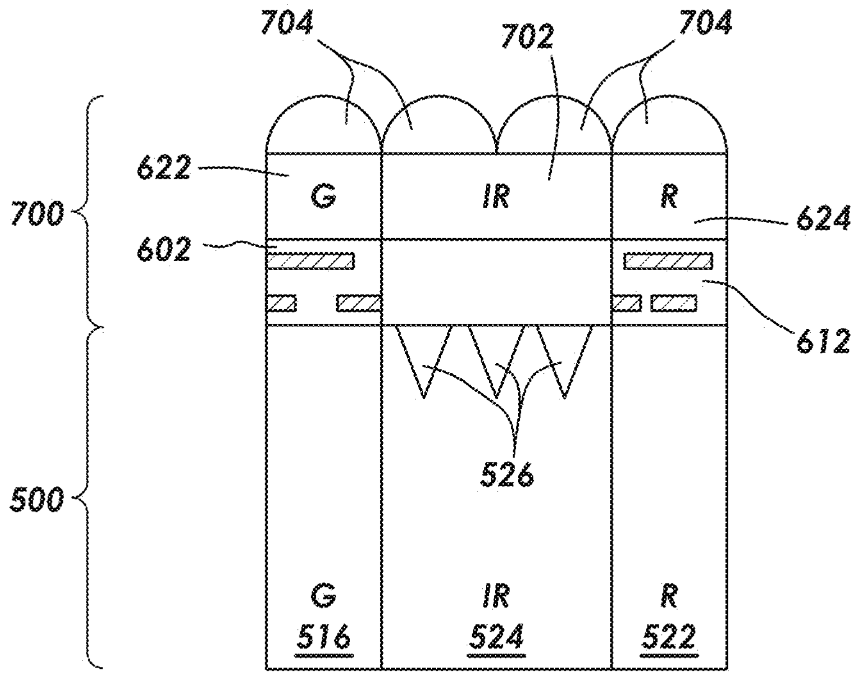
FIG. 7A is a cross-sectional view of a second spectral configuration for the first color pattern of FIG. 5 in accordance with some implementations.

FIG. 7A shows a cross-sectional view of a second spectral configuration 700 positioned above the first color pattern 500 of FIG. 5 in accordance with some implementations. The cross-sectional view in FIG. 7A is taken at line 5-5 of FIG. 5. FIG. 7A shows that the green spectral router 602 and the red spectral router 612 are not positioned above any portion of the infrared photodetector 524. FIG. 7A also shows that the first green spectral filter 622 and the red spectral filter 624 are not positioned above any portion of the infrared photodetector 524. Rather, FIG. 7A shows that an infrared spectral filter 702 is positioned over the infrared photodetector 524. The infrared spectral filter 702 is configured to pass infrared light and block (or absorb) visible light. The infrared spectral filter 702 is one example of a "second spectral filter." In some implementations, a plurality of microlenses 704 is positioned over the first green spectral filter 622, the red spectral filter 624, and the infrared spectral filter 702, as shown in FIG. 7A.

Figure 7B:
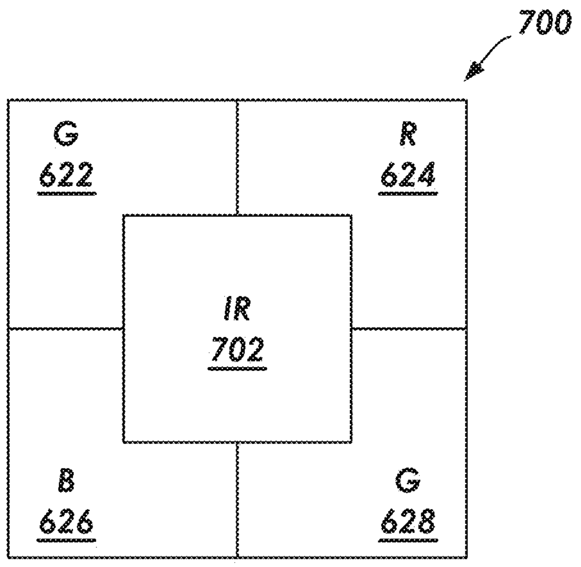
FIG. 7B is a top view of the second spectral configuration of FIG. 7A in accordance with some implementations.

FIG. 7B shows a top view of the second spectral configuration 700. As indicated in FIG. 7B, the first green spectral filter 622 is positioned above the green split-pixel 502 comprising the first green photodetector 512, the second green photodetector 514, and the third green photodetector 516. Further, as indicated in FIG. 7B, the red spectral filter 624 is positioned above the red split-pixel 504 comprising the first red photodetector 518, the second red photodetector 520, and the third red photodetector 522. Also, as indicated in FIG. 7B, the blue spectral filter 626 is positioned above the blue split-pixel 506. Further, as indicated in FIG. 7B, the second green spectral filter 628 is positioned above the second green split-pixel 508.

Figure 8:
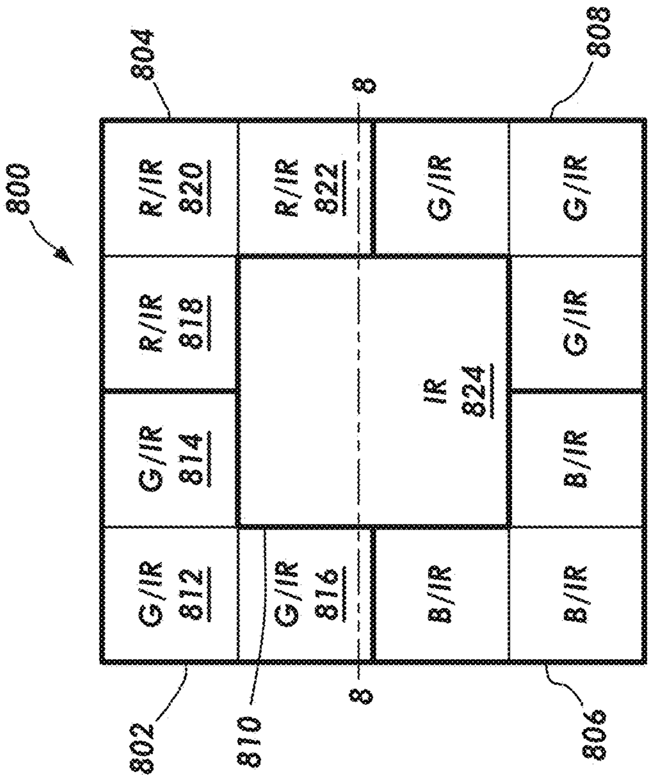
FIG. 8 is a view of an example of a second color pattern of split-pixels in which red, green, and blue pixels also detect infrared light in accordance with some implementations.

In some implementations, one or more pixels may be configured to detect a specific color of visible light and infrared light. FIG. 8 shows a view of an example of a second color pattern 800 of split-pixels. In particular, the second color pattern 800 includes a first green split-pixel 802, a red split-pixel 804, a blue split-pixel 806, a second green split-pixel 808, and an infrared pixel 810. The first green split-pixel 802 shown in FIG. 8 includes a first photodetector 812, a second photodetector 814, and a third photodetector 816 that are each configured to detect visible light in the green wavelength range and infrared light. The third photodetector 816 is in one example a "third photosensitive region." The third photodetector 816 is in another example a "first photosensitive region." The red split-pixel 804 shown in FIG. 8 includes a fourth photodetector 818, a fifth photodetector 820, and a sixth photodetector 822 that are each configured to detect visible light in the red wavelength range and infrared light. The blue split-pixel 806 shown in FIG. 8 includes three photodetectors that are each configured to detect visible light in the blue wavelength range and infrared light. The second green split-pixel 808 shown in FIG. 8 includes three photodetectors that are each configured to detect visible light in the green wavelength range and infrared light. The infrared pixel 810 includes a seventh photodetector 824 that is configured to detect infrared light. The seventh photodetector 824 is in one example a "second photosensitive region."

Figure 9A:
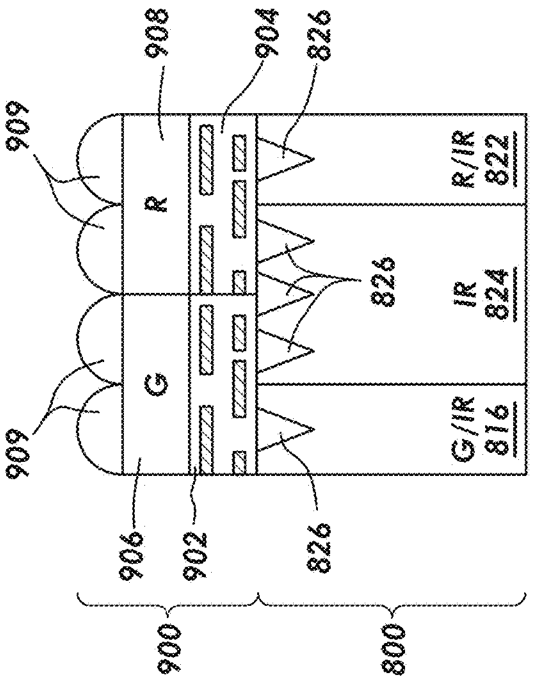
FIG. 9A is a cross-sectional view of a third spectral configuration for the second color pattern of FIG. 8 in accordance with some implementations.

FIG. 9A shows a cross-sectional view of a third spectral configuration 900 positioned above the second color pattern 800 of FIG. 8 in accordance with some implementations. The cross-sectional view in FIG. 9A is taken at line 8-8 of FIG. 8. Before discussing the third spectral configuration 900, note that FIG. 9A shows that the third photodetector 816, the sixth photodetector 822, and the seventh photodetector 824 each include one or more pyramid trenches 826 configured to disperse infrared light evenly across each of the photodetectors.

FIG. 9A shows that a green spectral router 902 is positioned above the third photodetector 816 and above a portion of the seventh photodetector 824. Although not visible in the cross-sectional view of FIG. 9A, the green spectral router 902 is also positioned above the first photodetector 812 and the second photodetector 814. The green spectral router 902 is configured to direct incident light in the green wavelength range to the first green split-pixel 802 in a same or similar way as described above in FIG. 7A. For example, the portion of the green spectral router 902 positioned above the third photodetector 816 is configured to pass visible light in the green wavelength range to the third photodetector 816. Further, the portion of the green spectral router 902 positioned above the seventh photodetector 824 is configured to direct visible light in the green wavelength range to the third photodetector 816. The green spectral router 902 is also configured to direct infrared light to the infrared pixel 810 or the first green split-pixel 802. For example, the portion of the green spectral router 902 positioned above the third photodetector 816 is configured to direct infrared light to the third photodetector 816 or the seventh photodetector 824. Further, the portion of the green spectral router 902 positioned above the seventh photodetector 824 is configured to direct infrared light to the third photodetector 816 or the seventh photodetector 824.

FIG. 9A also shows that a red spectral router 904 is positioned above the sixth photodetector 822 and above a portion of the seventh photodetector 824. Although not visible in the cross-sectional view of FIG. 9A, the red spectral router 904 is also positioned above the fourth photodetector 818 and the fifth photodetector 820. The red spectral router 904 is configured to direct incident light in the red wavelength range to the red split-pixel 804. For example, the portion of the red spectral router 904 positioned above the sixth photodetector 822 is configured to pass visible light in the red wavelength range to the sixth photodetector 822. Further, the portion of the red spectral router 904 positioned above the seventh photodetector 824 is configured to direct visible light in the red wavelength range to the sixth photodetector 822. The red spectral router 904 is also configured to direct infrared light to the infrared pixel 810 or the red split-pixel 804. For example, the portion of the red spectral router 904 positioned above the sixth photodetector 822 is configured to direct infrared light to the sixth photodetector 822 or the seventh photodetector 824. Further, the portion of the red spectral router 904 positioned above the seventh photodetector 824 is configured to direct infrared light to the sixth photodetector 822 or the seventh photodetector 824.

FIG. 9A also shows that a first green spectral filter 906 is positioned above the green spectral router 902. The first green spectral filter 906 is configured to pass visible light in the green wavelength range and block (or absorb) visible light outside of the green wavelength range. The first green spectral filter 906 is also configured to pass infrared light. In some implementations, the green spectral router 902 and the first green spectral filter 906 are two separate layers, as shown in FIG. 9A. In other implementations, the green spectral router 902 and the first green spectral filter 906 may be a single layer. For example, the green spectral router 902 and the first green spectral filter 906 may be a single layer formed of inorganic $SiO_2/Si_3N_4$ or $SiO_2/TiO_2$ materials. FIG. 9A further shows that a red spectral filter 908 is positioned above the red spectral router 904. The red spectral filter 908 is configured to pass visible light in the red wavelength range and block (or absorb) visible light outside of the red wavelength range. The red spectral filter 908 is also configured to pass infrared light. The red spectral router 612 and the red spectral filter 624 may be two separate layers (as shown in FIG. 9A) or a single layer. In some implementations, a plurality of microlenses 909 is positioned over the first green spectral filter 906 and the red spectral filter 908, as shown in FIG. 9A.

Figure 9B:
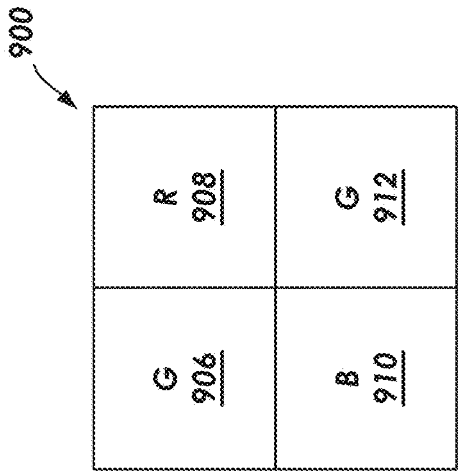
FIG. 9B is a top view of the third spectral configuration of FIG. 9A in accordance with some implementations.

FIG. 9B shows a top view of the third spectral configuration 900. As indicated in FIG. 9B, the first green spectral filter 906 is positioned above the first green split-pixel 802. Further, as indicated in FIG. 9B, the red spectral filter 908 is positioned above the red split-pixel 804. FIG. 9B also indicates that a blue spectral filter 910 is positioned above the blue split-pixel 806. The blue spectral filter 910 is configured to pass visible light in the blue wavelength range and block (or absorb) visible light outside of the blue wavelength range. The blue spectral filter 910 is also configured to pass infrared light. FIG. 9B also indicates that a second green spectral filter 912 is positioned above the second green split-pixel 808. The second green spectral filter 912 is configured to pass visible light in the green wavelength range and block (or absorb) visible light outside of the green wavelength range. The second green spectral filter 912 is also configured to pass infrared light.

Figure 10B:
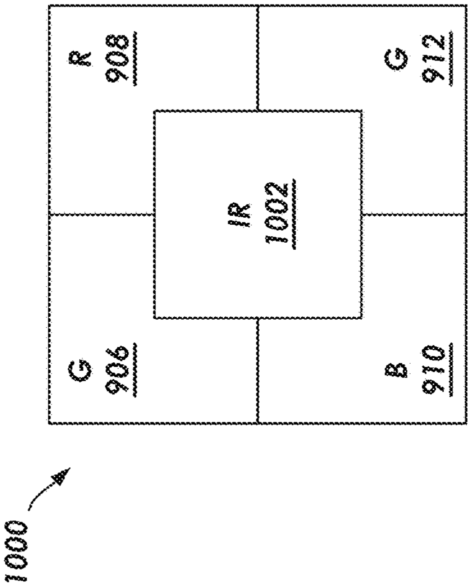
FIG. 10B is a top view of the fourth spectral configuration of FIG. 10A in accordance with some implementations.
Figure 10A:
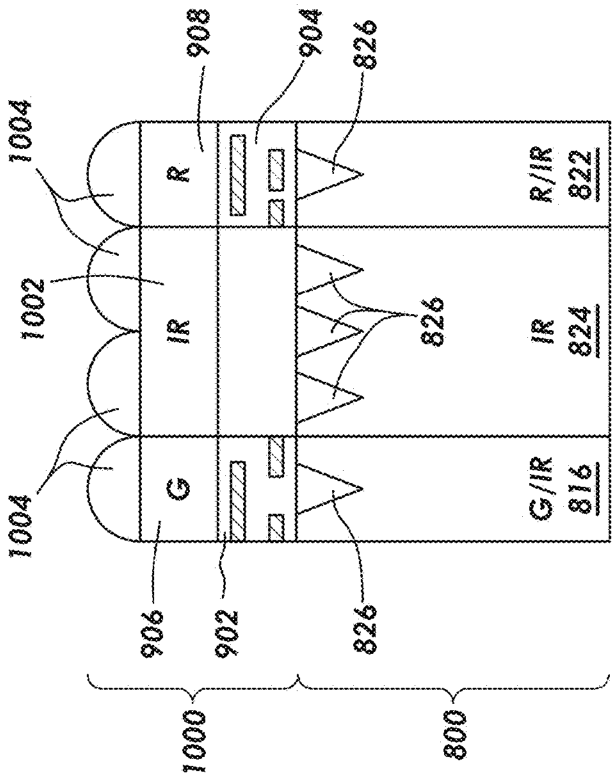
FIG. 10A is a cross-sectional view of a fourth spectral configuration for the second color pattern of FIG. 8 in accordance with some implementations.

FIG. 10A shows a cross-sectional view of a fourth spectral configuration 1000 positioned above the second color pattern 800 of FIG. 8 in accordance with some implementations. The cross-sectional view in FIG. 10A is taken at line 8-8 of FIG. 8. FIG. 10A shows that the green spectral router 902 and the red spectral router 904 are not positioned above any portion of the seventh photodetector 824. FIG. 10A also shows that the first green spectral filter 906 and the red spectral filter 908 are not positioned above any portion of the seventh photodetector 824. Rather, FIG. 10A shows that an infrared spectral filter 1002 is positioned over the seventh photodetector 824. The infrared spectral filter 1002 is configured to pass infrared light and block (or absorb) visible light. In some implementations, a plurality of microlenses 1004 is positioned over the first green spectral filter 906, the red spectral filter 908, and the infrared spectral filter 1002, as shown in FIG. 10A.

FIG. 10B shows a top view of the fourth spectral configuration 1000. As indicated in FIG. 10B, the first green spectral filter 906 is positioned above the first photodetector 812, the second photodetector 814, and the third photodetector 816. Further, as indicated in FIG. 10B, the red spectral filter 908 is positioned above the fourth photodetector 818, the fifth photodetector 820, and the sixth photodetector 822. Also, as indicated in FIG. 10B, the blue spectral filter 910 is positioned above the blue split-pixel 806. Further, as indicated in FIG. 10B, the second green spectral filter 912 is positioned above the second green split-pixel 808.

Figure 11:
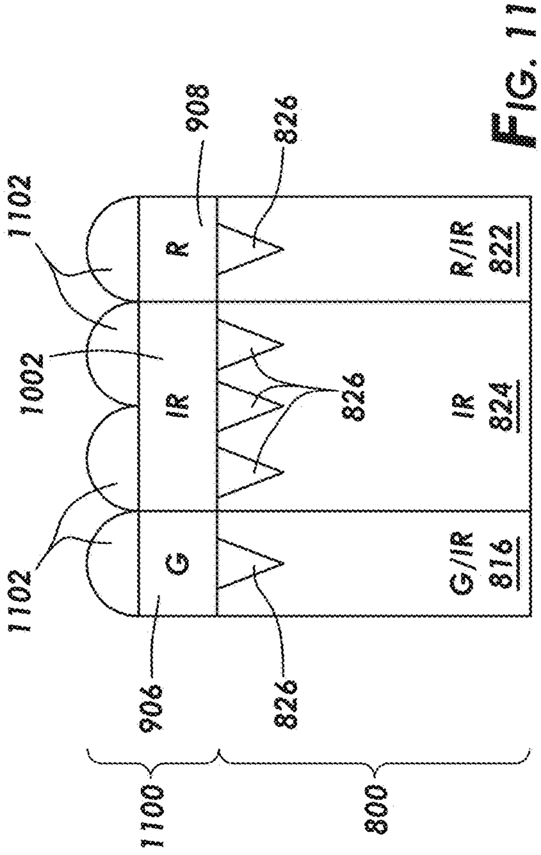
FIG. 11 is a cross-sectional view of a fifth spectral configuration with only spectral filters for the second color pattern of FIG. 8 in accordance with some implementations.

In some implementations, the spectral configuration only includes spectral filters and does not include a spectral router. FIG. 11 shows a cross-sectional view of a fifth spectral configuration 1100 positioned above the second color pattern 800 of FIG. 8 in accordance with some implementations. The cross-sectional view in FIG. 11 is taken at line 8-8 of FIG. 8. The first green spectral filter 906 in FIG. 11 is positioned directly over the third photodetector 816 without a spectral router therebetween. The third photodetector 816 in FIG. 11 is in one example a "first photosensitive region." The first green spectral filter 906 in FIG. 11 is one example of a "first spectral filter." Further, the red spectral filter 908 in FIG. 11 is positioned directly over the sixth photodetector 822 without a spectral router therebetween. The sixth photodetector 822 in FIG. 11 is in one example a "second photosensitive region." The red spectral filter 908 in FIG. 11 is one example of a "second spectral filter." Also, the infrared spectral filter 1002 in FIG. 11 is positioned directly over the seventh photodetector 824 without a spectral router therebetween. The seventh photodetector 824 in FIG. 11 is in one example a "third photosensitive region." The infrared spectral filter 1002 in FIG. 11 is one example of a "third spectral filter." In some implementations, a plurality of microlenses 1102 is positioned over the first green spectral filter 906, the red spectral filter 908, and the infrared spectral filter 1002, as shown in FIG. 11.

Figure 12:
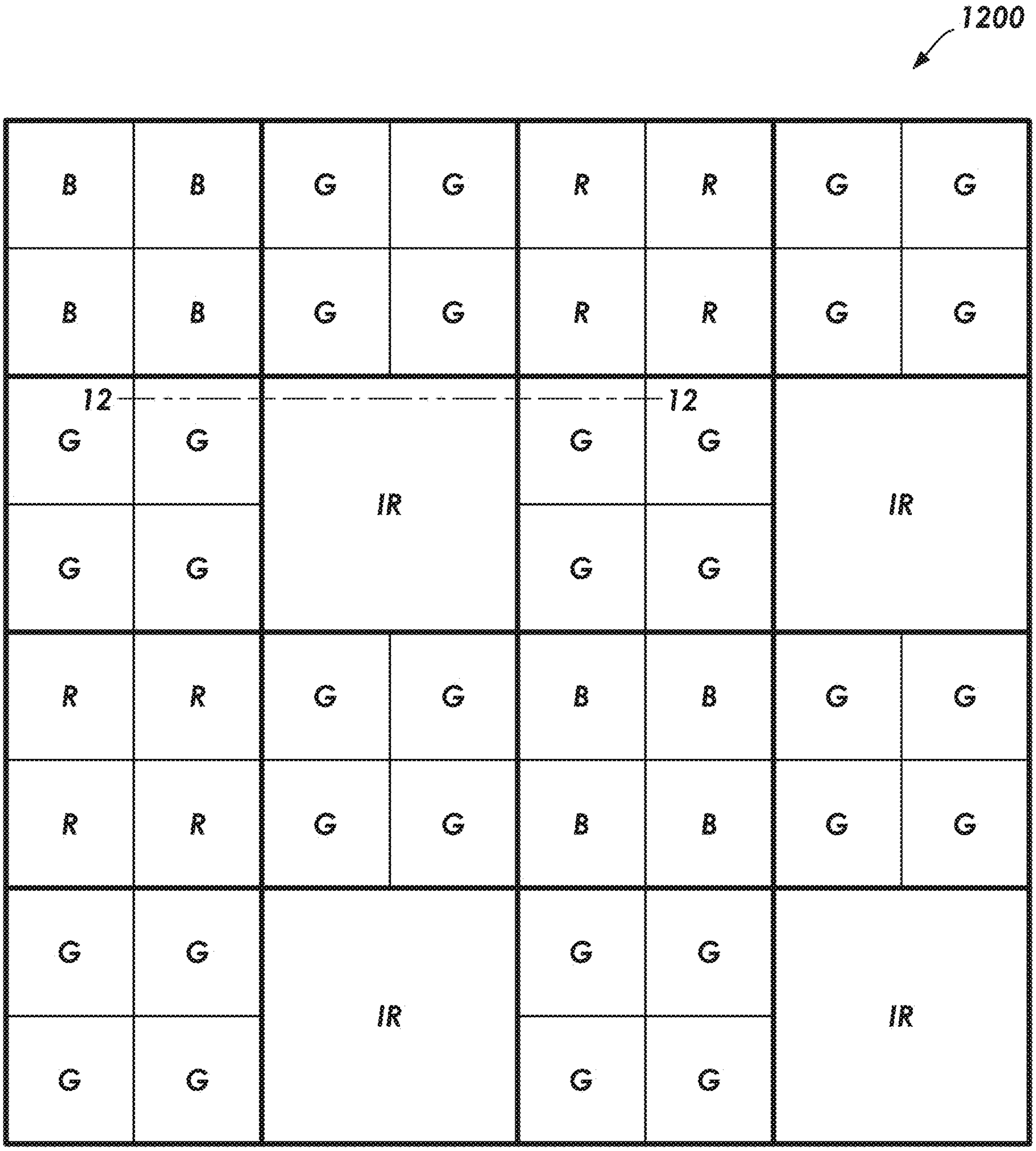
FIG. 12 is a view of an example of a third color pattern of split-pixels in which infrared pixels are positioned on the rows and columns of green split-pixels in accordance with some implementations.
Figure 13:
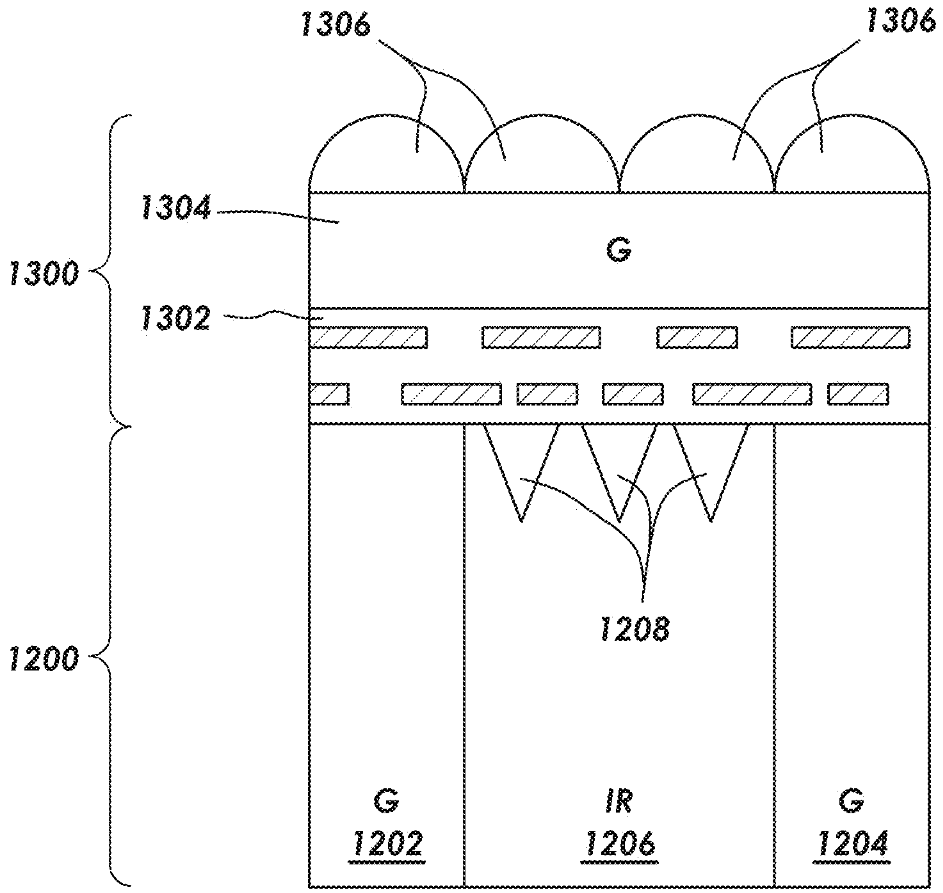
FIG. 13 is a cross-sectional view of a sixth spectral configuration for the third color pattern of FIG. 12 in accordance with some implementations.

FIG. 12 shows a view of an example of a third color pattern 1200 of split-pixels in which infrared pixels are positioned on the rows and columns of the green split-pixels. FIG. 13 shows a cross-sectional view of a portion of the third color pattern 1200 in accordance with some implementations. The cross-sectional view in FIG. 13 is taken at line 12-12 of FIG. 12. The portion of the third color pattern 1200 illustrated in FIG. 13 includes a first green photodetector 1202, a second green photodetector 1204, and an infrared photodetector 1206. The infrared photodetector 1206 is positioned between the first green photodetector 1202 and the second green photodetector 1204. The infrared photodetector 1206 includes a plurality of pyramid trenches 1208 configured to disperse infrared light evenly across the infrared photodetector 1206.

FIG. 13 also shows a cross-sectional view of a sixth spectral configuration 1300 positioned above the third color pattern 1200 of FIG. 12 in accordance with some implementations. In particular, FIG. 13 shows that a green spectral router 1302 is positioned above the first green photodetector 1202, the second green photodetector 1204, and the infrared photodetector 1206. The green spectral router 1302 is configured to direct incident light in the green wavelength range to the first green photodetector 1202 or the second green photodetector 1204. For example, the portion of the green spectral router 1302 positioned above the first green photodetector 1202 is configured to pass visible light in the green wavelength range to the first green photodetector 1202. Further, the portion of the green spectral router 1302 positioned above the second green photodetector 1204 is configured to pass visible light in the green wavelength range to the second green photodetector 1204. Also, the portion of the green spectral router 1302 positioned above the infrared photodetector 1206 is configured to direct visible light in the green wavelength range to the first green photodetector 1202 or the second green photodetector 1204. The green spectral router 1302 is also configured to direct infrared light to the infrared photodetector 1206. For example, the portion of the green spectral router 1302 positioned above the infrared photodetector 1206 is configured to pass infrared light to the infrared photodetector 1206. Further, the portion of the green spectral router 1302 positioned above the first green photodetector 1202 is configured to direct infrared light to the infrared photodetector 1206. Also, the portion of the green spectral router 1302 positioned above the second green photodetector 1204 is configured to direct infrared light to the infrared photodetector 1206. FIG. 13 also shows that a green spectral filter 1304 is positioned above the green spectral router 1302. The green spectral filter 1304 is configured to pass visible light in the green wavelength range and block (or absorb) visible light outside of the green wavelength range. The green spectral filter 1304 is also configured to pass infrared light. In some implementations, a plurality of microlenses 1306 is positioned over the green spectral filter 1304.

Figure 14:
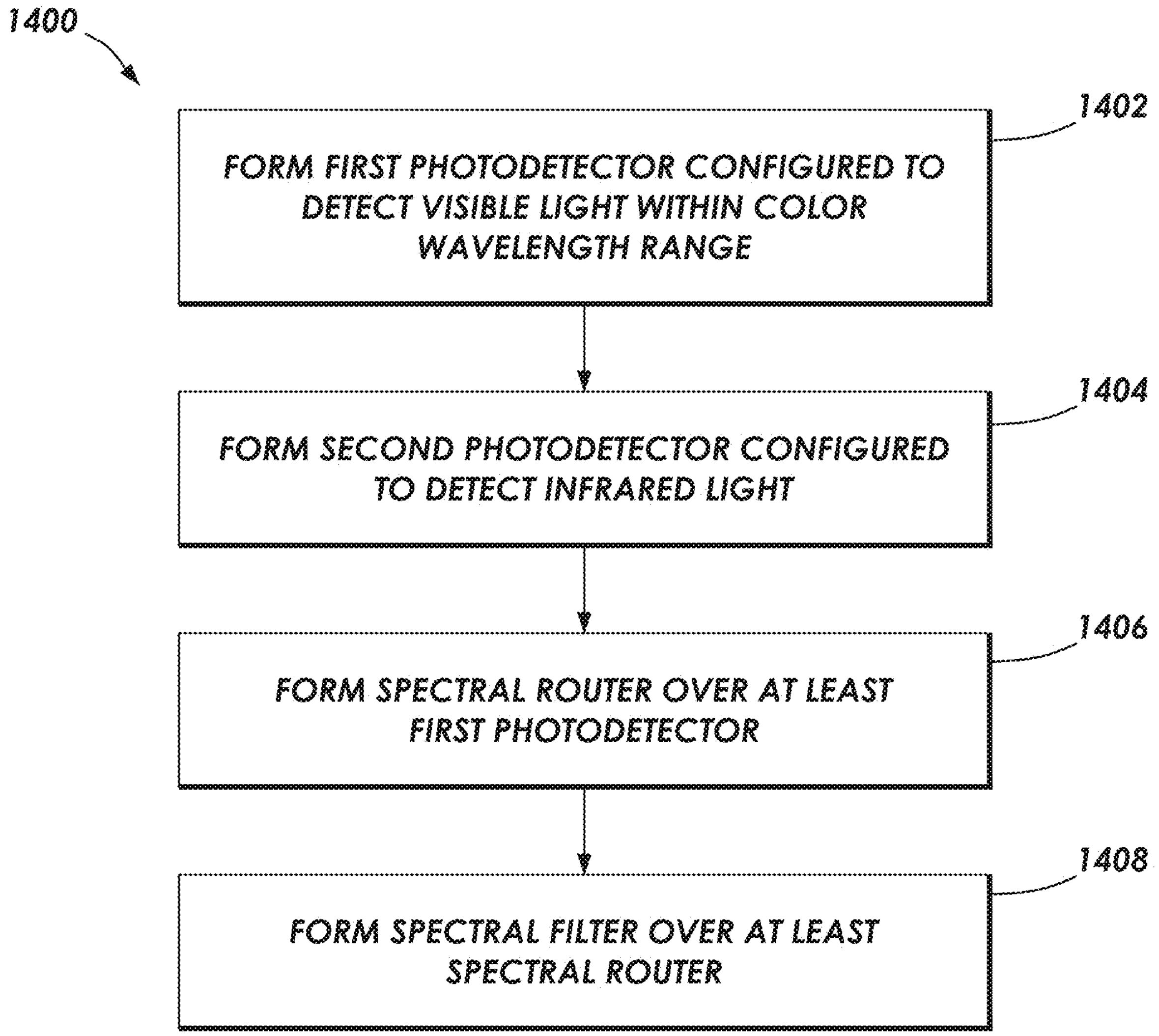
FIG. 14 is a flow diagram of an example of a method for constructing an image sensor in accordance with some implementations.

FIG. 14 is a flow diagram of an example of a method 1400 for constructing an image sensor in accordance with some implementations. For simplicity of explanation, the method 1400 is depicted in FIG. 14 and described as a series of operation. However, the operations can occur in various orders and/or concurrently, and/or with other operations not presented and described herein. At block 1402, a first photodetector is formed. The first photodetector is configured to detect visible light within a color wavelength range. At block 1404, a second photodetector is formed. The second photodetector is configured to detect infrared light. At block 1406, a spectral router is formed over at least the first photodetector. At block 1408, a spectral filter is formed over at least the spectral router. The spectral filter is configured to block visible light outside of the color wavelength range.

Many of the electrical connections in the drawings are shown as direct couplings having no intervening devices, but not expressly stated as such in the description above. Nevertheless, this paragraph shall serve as antecedent basis in the claims for referencing any electrical connection as "directly coupled" for electrical connections shown in the drawing with no intervening device(s).

The above discussion is meant to be illustrative of the principles and various implementations of the present invention. Numerous variations and modifications will become apparent to those skilled in the art once the above disclosure is fully appreciated. It is intended that the following claims be interpreted to embrace all such variations and modifications.

What is claimed is:

1. An image sensor, comprising:
a pixel array including:
a first photosensitive region configured to detect visible light within a color wavelength range,
a second photosensitive region including a plurality of light scattering structures and configured to detect infrared light,
a spectral router positioned over at least the first photosensitive region and configured to:
route the visible light within the color wavelength range to the first photosensitive region, and
route the infrared light to the second photosensitive region;
a spectral filter positioned over the spectral router and configured to block visible light outside of the color wavelength range; and
a plurality of microlenses positioned over the spectral filter.

2. The image sensor of claim 1, wherein the spectral router and the spectral filter are further positioned over a portion of the second photosensitive region.

3. The image sensor of claim 2, wherein the first photosensitive region is further configured to detect the infrared light, and
wherein the first photosensitive region includes one or more of the plurality of light scattering structures.

4. The image sensor of claim 1, wherein the spectral filter is a first spectral filter, and
wherein the pixel array further includes a second spectral filter positioned over the second photosensitive region and configured to block visible light.

5. The image sensor of claim 4, wherein the first photosensitive region is further configured to detect the infrared light, and
wherein the first photosensitive region includes one or more of the plurality of light scattering structures.

6. The image sensor of claim 1, wherein the spectral router is a first spectral router,
wherein the spectral filter is a first spectral filter,
wherein the color wavelength range is a first color wavelength range, and
wherein the pixel array further includes:
a third photosensitive region configured to detect visible light within a second color wavelength range,
a second spectral router positioned over at least the third photosensitive region and configured to:
route the visible light within the color second wavelength range to the third photosensitive region, and
route the infrared light to the second photosensitive region, and
a second spectral filter positioned over at least the second spectral router and configured to block visible light outside of the second color wavelength range.

7. The image sensor of claim 1, wherein the pixel array further includes a third photosensitive region configured to detect visible light within the color wavelength range,
wherein the second photosensitive region is positioned between the first photosensitive region and the third photosensitive region, and
wherein the spectral router and the spectral filter are further positioned over the second photosensitive region and the third photosensitive region.

8. An imaging system, comprising:
a lens system;
an imaging controller; and
the image sensor of claim 1, wherein the image sensor is in operational relationship with the lens system and is electrically coupled to the imaging controller.

9. The imaging system of claim 8, wherein the imaging system is at least one selected from the group consisting of an automobile, a vehicle, a camera, a cellular telephone, a tablet computer, a webcam, a video camera, a video surveillance system, and a video gaming system.

10. A method for constructing an image sensor, the method comprising:
forming a first photodetector configured to detect visible light within a color wavelength range;
forming a second photodetector configured to detect infrared light;
forming a spectral router over at least the first photodetector, wherein the spectral router is configured to:
route the visible light within the color wavelength range to the first photodetector, and
route the infrared light to the second photodetector;
forming a spectral filter over at least the spectral router, wherein the spectral filter is configured to block visible light outside of the color wavelength range; and
forming a plurality of microlenses over the spectral filter.

11. The method of claim 10, further comprising forming a plurality of light scattering structures in the second photodetector.

12. The method of claim 11, further comprising forming one or more of the light scattering structures in the first photodetector.

13. The method of claim 10, wherein the spectral filter is a first spectral filter,
wherein the method further comprises forming a second spectral filter over the second photodetector, and
wherein the second spectral filter is configured to block visible light.

14. The method of claim 10, wherein the spectral router is a first spectral router,
wherein the spectral filter is a first spectral filter, wherein the color wavelength range is a first color wavelength range, and
wherein the method further comprises:
forming a third photodetector configured to detect visible light within a second color wavelength range;
forming a second spectral router over at least the third photodetector, wherein the second spectral router is configured to:
route the visible light within the color second wavelength range to the third photodetector, and
route the infrared light to the second photodetector; and
forming a second spectral filter over the second spectral router, wherein the second spectral filter is configured to block visible light outside of the second color wavelength range.

15. The method of claim 10, further comprising forming a third photodetector configured to detect visible light within the color wavelength range,
wherein the second photodetector is positioned between the first photodetector and the third photodetector, and wherein the spectral router and the spectral filter are further positioned over the second photodetector and the third photodetector.

16. An imaging system, comprising:

a lens system;

an imaging controller; and an image sensor in operational relationship with the lens system and is electrically coupled to the imaging controller, wherein the image sensor including:

a first photosensitive region including one of more first pyramid trenches and configured to:

detect visible light within a first color wavelength range, and detect infrared light, a first spectral filter positioned over the first photosensitive region and configured to block visible light outside of the first color wavelength range, a second photosensitive region including one of more second pyramid trenches and configured to:

detect visible light within a second color wavelength range, and detect the infrared light, and a second spectral filter positioned over the second photosensitive region and configured to block visible light outside of the second color wavelength range, a third photosensitive region including one or more third pyramid trenches and positioned between the first photosensitive region and the second photosensitive region, wherein the third photosensitive region is configured to detect the infrared light, and a third spectral filter positioned over the third photosensitive region and configured to block visible light.

17. The imaging system of claim 16, wherein the image sensor further includes a plurality of microlenses positioned over the first spectral filter, the second spectral filter, and the third spectral filter.

18. The imaging system of claim 16, wherein the imaging system is at least one selected from the group consisting of an automobile, a vehicle, a camera, a cellular telephone, a tablet computer, a webcam, a video camera, a video surveillance system, and a video gaming system.

* * * * *